United States Patent
Choi et al.

(10) Patent No.: US 8,618,628 B2
(45) Date of Patent: Dec. 31, 2013

(54) BUFFERED FUSE FOR INTEGRATED CIRCUIT RECONFIGURATION BY LASER

(75) Inventors: Ki Soo Choi, Cheongju-si (KR); Do Hyun Kim, Incheon-si (KR)

(73) Assignee: Hynix Semiconductor Inc., Icheon (KR)

( * ) Notice: Subject to any disclaimer, the term of this patent is extended or adjusted under 35 U.S.C. 154(b) by 80 days.

(21) Appl. No.: 13/253,607

(22) Filed: Oct. 5, 2011

(65) Prior Publication Data

US 2012/0104617 A1    May 3, 2012

(30) Foreign Application Priority Data

Oct. 27, 2010    (KR) ........................ 10-2010-0105354

(51) Int. Cl.
    *H01L 23/52*      (2006.01)

(52) U.S. Cl.
    USPC ............ 257/529; 257/530; 438/131; 438/132

(58) Field of Classification Search
    CPC ......................... H01L 23/5258; H01L 23/5256
    USPC .................. 257/529, 774, E21.592, E23.157, 257/E23.15, E21.596, 530, 209; 438/131, 438/132

See application file for complete search history.

(56) References Cited

U.S. PATENT DOCUMENTS

| | | | |
|---|---|---|---|
| 6,713,837 B1 * | 3/2004 | Mori et al. | 257/529 |
| 7,696,602 B2 * | 4/2010 | Kim | 257/529 |
| 2007/0122945 A1 | 5/2007 | Kim | |
| 2008/0020560 A1 * | 1/2008 | Choi | 438/601 |
| 2009/0102013 A1 * | 4/2009 | Park | 257/529 |
| 2010/0123212 A1 * | 5/2010 | Chung et al. | 257/529 |

FOREIGN PATENT DOCUMENTS

| | | |
|---|---|---|
| JP | 2000-114382 A | 4/2000 |
| KR | 1020060011475 A | 2/2006 |

* cited by examiner

*Primary Examiner* — Stephen W Smoot
*Assistant Examiner* — Pavel Ivanov

(57) ABSTRACT

A semiconductor device and a method for manufacturing the same are disclosed. A dummy pattern is formed between a fuse pattern and a semiconductor substrate so as to prevent the semiconductor substrate from being damaged, and a buffer pattern is formed between the dummy pattern and the semiconductor substrate, so that a dummy metal pattern primarily absorbs or reflects laser energy transferred to the semiconductor substrate during the blowing of the fuse pattern, and the buffer pattern secondarily reduces stress generated between the dummy pattern and the semiconductor substrate, resulting in the prevention of a defect such as a crack.

6 Claims, 3 Drawing Sheets

BUFFERED FUSE FOR INTEGRATED CIRCUIT RECONFIGURATION BY LASER

CROSS-REFERENCE TO RELATED APPLICATION

The priority of Korean patent application No. 10-2010-0105354 filed on 27 Oct. 2010, the disclosure of which is hereby incorporated in its entirety by reference, is claimed.

BACKGROUND OF THE INVENTION

Embodiments of the present invention relate to a semiconductor device and a method for manufacturing the same.

In recent times, as information media such as computers have rapidly come into wide use, technology of a semiconductor device has been rapidly developed. To keep up with the rapid pace of development, it is necessary for the semiconductor device to be capable of operating at high speed and have high storage capacity. Therefore, technology of manufacturing the semiconductor device has been rapidly developed to improve the degree of integration, reliability, response speed, etc.

A process for manufacturing a semiconductor device includes a fabrication process that forms cells each having an integrated circuit by repeatedly forming a predetermined circuit pattern on a silicon substrate, and an assembly process that packages the substrate including the cells in units of a chip. An Electrical Die Sorting (EDS) process for testing electrical characteristics of cells formed over the substrate is performed between the fabrication process and the assembly process.

The above-mentioned EDS process may determine whether the cells formed over the substrate are good or defective. The EDS process is adapted to remove such defective cells prior to execution of the assembly process, such that efforts or costs consumed in the assembly process may be reduced. In addition, the defective cells may be detected in early stages and be reproduced through a repair process.

A more detailed description of the repair process is as follows.

In order to increase the production yield of semiconductor devices, a redundant cell is added to substitute for a defective device or circuit, and a fuse for coupling the redundant cell to the integrated circuit is also added to the manufacturing process of the semiconductor device. The repair process couples a defective cell detected by the test process to a redundant cell contained in the chip using the fuse, resulting in cell recovery.

A method for repairing the semiconductor device according to the related art will hereinafter be described in detail.

First of all, after a planarized interlayer insulation film is deposited over a fuse region of the semiconductor substrate, a plurality of fuse patterns is formed over the interlayer insulation film. Thereafter, an insulation film covering the fuse patterns is deposited over the resultant semiconductor substrate. Subsequently, repair-etching of some thickness of the insulation film is performed, so that a repair-trench that enables an insulation film having a predetermined thickness to remain in a blowing region (i.e., a fuse pattern) is formed.

Thereafter, established testing and repairing processes are sequentially performed, including a fuse blowing process that cuts a specific fuse by applying laser energy to the fuse region of the semiconductor substrate.

After a repair-trench that enables an insulation film having a predetermined thickness to remain on the fuse pattern is formed, a fuse blowing process is performed. In this case, provided that the insulation film remaining on the fuse pattern has a large thickness, when thermal energy is focused on the fuse during the fuse blowing and then reaches a threshold point, an upper explosion occurs in the fuse so that the fuse is blown. Provided that the insulation film has a large thickness, a crack occurs in a lower part prior to execution of the upper explosion, and a metal residue is generated in the crack, resulting in creation of a defective part. In contrast, provided that the insulation film remaining on the fuse pattern has a small thickness, thermal energy is better focused on the fuse. However, thermal energy is exposed and emitted to the air, so that defective or poor fuse blowing occurs.

In order to improve the defective fuse blowing, a metal bare fuse that need not adjust thickness of the remaining insulation film has been introduced. However, metal residue remains when the metal bare fuse is blown using a laser so that a defective fuse is generated. In addition, since an upper part and sidewalls of the metal bare fuse are exposed, oxygen or moisture is permeated into the exposed fuse in a subsequent process (i.e., a wafer packaging process), so that fuse volume expansion and fuse oxidation occur, resulting in a reduced production yield.

FIGS. 1(*i*) and 1(*ii*) are layout and cross-sectional views illustrating a semiconductor device and a method for manufacturing the same according to an embodiment of the present invention. In more detail, FIG. 1(*i*) is a layout of a semiconductor device, and FIG. 1(*ii*) is a cross-sectional view illustrating the semiconductor device.

Referring to FIG. 1, an interlayer insulation film 110 is formed over the semiconductor substrate 100. In this case, the interlayer insulation film 110 may include an oxide film.

Subsequently, a conductive layer (not shown) is formed over the interlayer insulation film 100. After a photoresist film is formed over the conductive layer, a photoresist pattern (not shown) is formed by the exposure and development process using a lower line mask. The conductive layer is etched using the photoresist pattern as a mask, so that a lower line 120 is formed.

Thereafter, a second interlayer insulation film 130 is formed over the lower line 120 and the exposed interlayer insulation film 110. The second interlayer insulation film 130 may include an oxide film.

After a photoresist film is formed over the second interlayer insulation film 130, a photoresist pattern (not shown) is formed using the exposure and development process with a contact plug mask. The second interlayer insulation film 130 is etched using the photoresist pattern as a mask until the lower line 120 is exposed, so that a contact plug region (not shown) is formed. After that, the conductive layer is buried in the contact plug region, so that the contact plug 140 is formed.

Subsequently, after a metal layer (not shown) is formed over the contact plug 140 and the second interlayer insulation film 130, a fuse pattern 150 coupled to the contact plug 140 is formed by etching the metal layer. In this case, the metal layer may include copper (Cu). The fuse pattern 150 may be formed in a pad or line shape.

After that, a third insulation film (not shown) is formed over the entire surface including the fuse pattern 150, and laser blowing 170 is performed in a predetermined region 160 of the fuse pattern 150. There arise many problems in the laser blowing 170; for example, a spot size or pitch of the laser may be larger than the fuse pattern 150 to be blown, or laser energy may be transferred even to the semiconductor substrate 100 due to a large wavelength or high intensity of the laser. Due to such laser blowing, damage of the semiconductor substrate 100 may occur as shown in the A part.

BRIEF SUMMARY OF THE INVENTION

Various embodiments of the present invention are directed to a semiconductor device and a method for manufacturing the same that substantially obviates one or more problems due to limitations and disadvantages of the related art.

An embodiment of the present invention relates to a semiconductor device and a method for manufacturing the same, in which a dummy pattern is formed between a fuse pattern and a semiconductor substrate so as to prevent the semiconductor substrate from being damaged, and a buffer film is formed between the dummy pattern and the semiconductor substrate so that a dummy metal pattern primarily absorbs or reflects laser energy transferred to the semiconductor substrate during the blowing of the fuse pattern and the buffer film secondarily reduces stress generated between the dummy pattern and the semiconductor substrate, resulting in the prevention of a defect such as a crack.

In accordance with an aspect of the present invention, a method for manufacturing a semiconductor device includes forming a first insulation film over a semiconductor substrate; forming a lower line and a first dummy line over the first insulation film, wherein the lower line and the first dummy line are formed over the same layer; forming a second insulation film over the first dummy line, the lower line, and the first insulation film; forming a contact plug coupled to the lower line in the second insulation film; forming a fuse pattern coupled to the contact plug, wherein the fuse pattern is formed over the second insulation film in such a manner that the fuse pattern overlaps with a vertical direction of the first dummy line; and blowing the fuse pattern.

The fuse pattern may include copper (Cu).

The first dummy line may include polysilicon, aluminium (Al), tungsten (W), cobalt (Co), titanium (Ti), tungsten silicide, cobalt silicide, or titanium silicide.

The first dummy line may be larger in width than a blowing region of the fuse pattern.

The lower line and the first dummy line may be simultaneously formed.

The first dummy line may have a smaller width than the fuse pattern or may have the same width as the fuse pattern.

The forming of the contact plug may include etching the second insulation film using a contact plug mask until the lower line is exposed, thereby forming a contact hole; and burying a conductive material in the contact hole.

The method may further include forming a buffer pattern in the first insulation film.

The buffer pattern may include metal.

The forming of the buffer pattern may include, after forming the first insulation film over the semiconductor substrate, etching the first insulation film using a mask for buffer pattern formation until the semiconductor substrate is exposed, thereby forming a hole; and burying a conductive material in the hole.

The method may further include forming a second dummy line among an upper part of the buffer pattern, the lower line, and the first dummy line in such a manner that the second dummy line is coupled to the buffer pattern.

The second dummy line may include polysilicon, aluminium (Al), tungsten (W), cobalt (Co), titanium (Ti), tungsten silicide, cobalt silicide, or titanium silicide.

In accordance with another aspect of the present invention, a semiconductor device include a first insulation film formed over a semiconductor substrate; a first dummy line and a lower line that are formed over the first insulation film and are formed over the same layer; a second insulation film formed over the first dummy line, the lower line, and the first insulation film; a contact plug formed in the second insulation film and coupled to the lower line; and a fuse pattern coupled to the contact plug, wherein the fuse pattern is formed over the second insulation film in such a manner that the fuse pattern overlaps with a vertical direction of the first dummy line.

The fuse pattern may include copper (Cu).

The first dummy line may include polysilicon, aluminium (Al), tungsten (W), cobalt (Co), titanium (Ti), tungsten silicide, cobalt silicide, or titanium silicide.

The first dummy line may have a smaller width than the fuse pattern.

The semiconductor device may further include a buffer pattern contained in the first insulation film.

The semiconductor device may further include a second dummy line formed among an upper part of the buffer pattern, the lower line, and the first dummy line in such a manner that the second dummy line is coupled to the buffer pattern.

The second dummy line may be formed over a layer different from that of the first dummy line.

The second dummy line may include polysilicon, aluminium (Al), tungsten (W), cobalt (Co), titanium (Ti), tungsten silicide, cobalt silicide, or titanium silicide.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the drawings.

Figure 1:
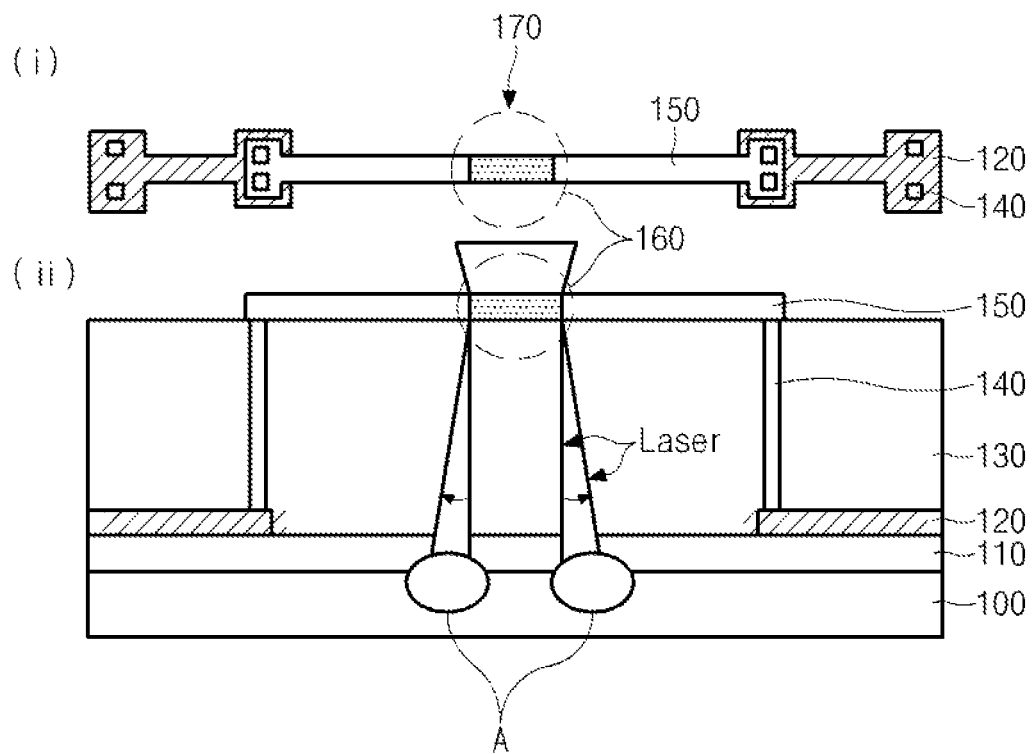
FIGS. 1(*i*) and 1(*ii*) are cross-sectional views illustrating a semiconductor device and a method for manufacturing the same according to the related art.
Figure 2:
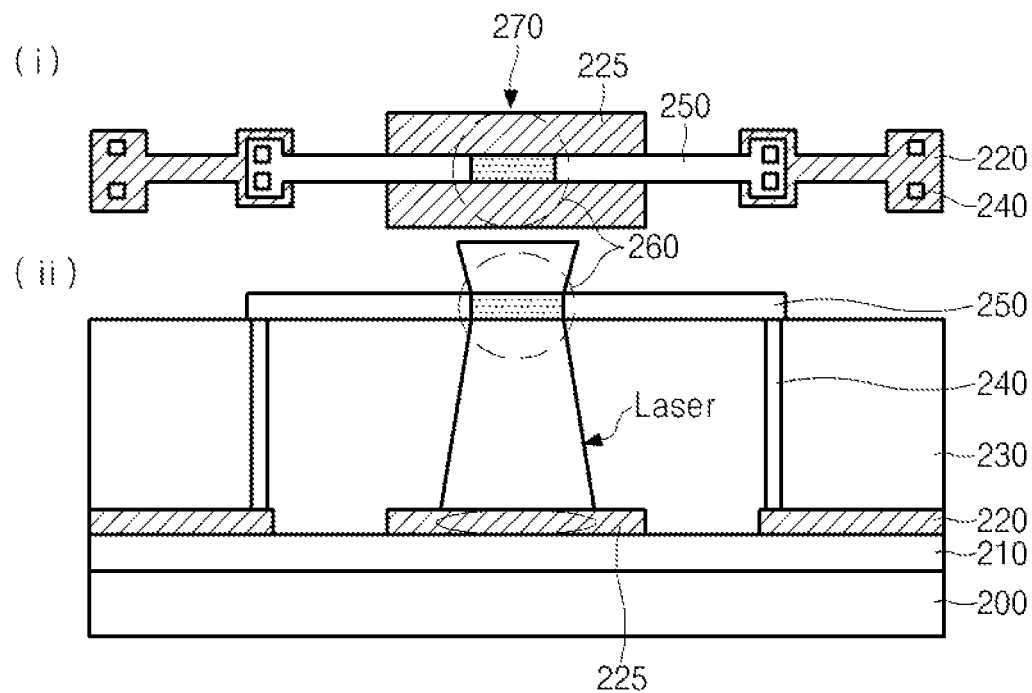
FIGS. 2(*i*) and 2(*ii*) are cross-sectional views illustrating a semiconductor device and a method for manufacturing the same according to one embodiment of the present invention.

FIGS. 2(*i*) and 2(*ii*) are cross-sectional views illustrating a semiconductor device and a method for manufacturing the same according to one embodiment of the present invention. In more detail, FIG. 2(*i*) shows a layout of the semiconductor device, and FIG. 2(*ii*) shows a cross-sectional view of the semiconductor device.

Referring to FIGS. 2(*i*) and 2(*ii*), a first insulation film 210 is formed over the semiconductor substrate 200. The first insulation film 210 may include an oxide film.

A first conductive layer (not shown) is formed over the first insulation film 210. After a photoresist film is formed over the first conductive layer, a photoresist pattern (not shown) is formed by an exposure and development process using a lower line and a dummy line mask. The first conductive layer is etched using the photoresist pattern as a mask, so that a lower line 220 and a first dummy line 225 are formed. The lower line 220 and the first dummy line 225 may include polysilicon, metal, and silicide. Preferably, the metal may include aluminum (Al), tungsten (W), cobalt (Co), titanium (Ti), or the like. The silicide may include tungsten silicide, cobalt silicide, titanium silicide, or the like. In this implementation, the lower line 220 and the first dummy line 225 may be simultaneously formed using one mask. Alternatively, after the lower line 220 is formed using the lower line mask and the dummy line mask, the first dummy line 225 may be formed. The lower line 220 and the first dummy line 225 may be formed over the same layer.

Subsequently, a second insulation film 230 is formed over the lower line 220, the first dummy line 225, and the exposed first insulation film 210. The second insulation film 230 may include an oxide film.

Thereafter, after a photoresist film is formed over the second insulation film 230, a photoresist pattern (not shown) is formed using the exposure and development process and a contact plug mask. The second insulation film 230 is etched using the photoresist pattern as a mask until the lower line 220 is exposed, so that a contact plug region (not shown) is formed. Thereafter, the conductive layer is buried in the contact plug region, so that a contact plug 240 is formed.

After a metal layer (not shown) is formed over the contact plug 240 and the second insulation film 230, the metal layer is etched so that a fuse pattern 250 coupled to the contact plug 240 is formed. The fuse pattern 250 may include copper (Cu). In addition, the fuse pattern 250 may be longer than the first dummy line 225, or may have the same length as that of the first dummy line 225.

Thereafter, a third insulation film (not shown) is formed over the entire surface including the fuse pattern 250, and laser blowing 270 is performed in a predetermined region 260 of the fuse pattern 250. For laser blowing 270, when the spot size or pitch of the laser is large relative to the fuse, the wavelength is longer or energy is higher than necessary, energy may be transferred to substrate 200 resulting in damage. In order to overcome these problems, an embodiment of the present invention further includes the first dummy line 225 formed over the semiconductor substrate 200, so that laser energy is absorbed in or reflected from the first dummy line 225 during the laser blowing 270, and thus the resultant laser energy is not applied to the semiconductor substrate 200 due to the first dummy line 225.

Figure 3:
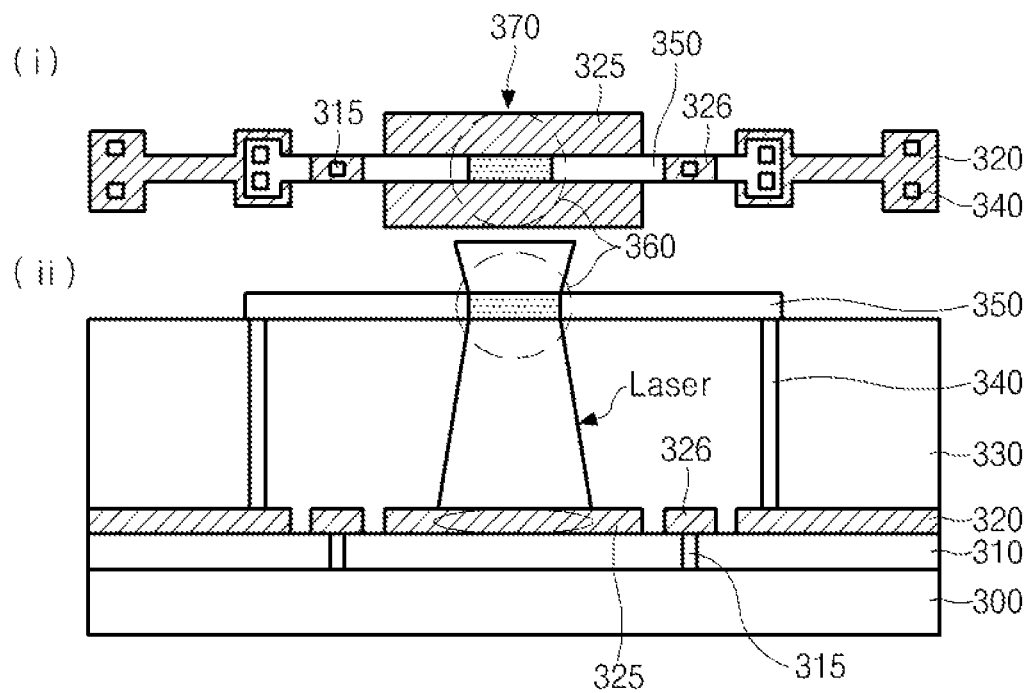
FIGS. 3(*i*) and 3(*ii*) are cross-sectional views illustrating a semiconductor device and a method for manufacturing the same according to another embodiment of the present invention.

FIGS. 3($i$) and 3($ii$) are cross-sectional views illustrating a semiconductor device and a method for manufacturing the same according to another embodiment of the present invention.

Referring to FIGS. 3($i$) and 3($ii$), the first insulation film 310 is formed over the semiconductor substrate 300. The first insulation film 310 may include an oxide film.

Subsequently, a predetermined part of the first insulation film 310 is etched until the semiconductor substrate 300 is exposed, and a metal material is buried in the etched region, so that a buffer pattern 315 is formed. The buffer pattern 315 may absorb energy generated in the laser blowing and prevent a defect such as a crack from being generated. The buffer pattern 315 may be formed over a plurality of layers. In an embodiment, a plurality of buffer patterns 315 may be formed. The buffer pattern 315 may include polysilicon, metal, and silicide.

Next, a first conductive layer (not shown) is formed over the first insulation film 310. After a photoresist film is formed over the first conductive layer, a photoresist pattern (not shown) is formed by an exposure and development process using a lower line, a first dummy line and a second dummy line mask. The first conductive layer is etched using the photoresist pattern as a mask, so that a lower line 320, a first dummy line 325, and a second dummy line 326 are formed. In this case, the lower line 320, the first dummy line 325, and the second dummy line 326 may include polysilicon, metal, and silicide. Preferably, the metal may include aluminum (Al), tungsten (W), cobalt (Co), titanium (Ti), or the like. The silicide may include tungsten silicide, cobalt silicide, titanium silicide, or the like. In this embodiment, the lower line 320 and the first and second dummy lines 325 and 326 may be simultaneously formed using one mask. After the lower line 320 is formed using each of the first dummy line and the second dummy line mask, the first and second dummy lines 325 and 326 may be formed. In this implementation, the second dummy line 326 is formed between the lower line 320 and the first dummy line 325, and the second dummy line 326 is coupled to the buffer pattern 315. The second dummy line 326 and the buffer pattern 315 may be formed over a plurality of layers. The second dummy line 326 and the first dummy line 325 may be formed over the same layer. The second dummy line 326 may also be formed in an upper layer including the first dummy line 325.

Subsequently, a second insulation film 330 is formed over the lower line 320, the first dummy line 325, and the exposed first insulation film 310. In this case, the second insulation film 330 may include an oxide film.

Thereafter, after the photoresist film is formed over the second insulation film 330, a photoresist pattern (not shown) is formed using an exposure and development process with a contact plug mask. The second insulation film 330 is etched using the photoresist pattern as a mask until the lower line 320 is exposed, so that a contact plug region (not shown) is formed. Thereafter, the conductive layer is buried in the contact plug region, so that a contact plug 340 is formed.

After a metal layer (not shown) is formed over the contact plug 340 and the second insulation film 330, the metal layer is etched so that a fuse pattern 350 coupled to the contact plug 340 is formed. The fuse pattern 350 may include copper (Cu). In addition, the fuse pattern 350 may be longer than the first or second dummy line 325 or 326.

Thereafter, a third insulation film (not shown) is formed over the entire surface including the fuse pattern 350, and laser blowing 370 is performed in a predetermined region 360 of the fuse pattern 350. For laser blowing 370, when the spot size or pitch of the laser is large relative to the fuse, the wavelength is longer or energy is higher than necessary, energy may be transferred to substrate 300 resulting in damage. In order to overcome the above-mentioned problem, in case of the laser blowing 370 according to an embodiment of the present invention, laser energy is absorbed or reflected by the first dummy line 325 and thus the first dummy line 325 prevents the resultant laser energy from being applied to the semiconductor substrate 300. In addition, the buffer film 315 may further absorb laser energy that has not been partially absorbed in the first dummy line 325 or may further reflect the same laser energy, and may reduce stress generated by such laser energy.

As is apparent from the above description, for a semiconductor device and a method for manufacturing the same according to the above-mentioned embodiments of the present invention, a dummy pattern is formed between a fuse pattern and a semiconductor substrate to prevent the semiconductor substrate from being damaged during a fuse blowing operation, and a buffer film is formed between the dummy pattern and the semiconductor substrate, so that the dummy metal pattern absorbs or reflects laser energy transferred to the semiconductor substrate during the blowing of the fuse, and the buffer film secondarily reduces stress generated between the dummy pattern and the semiconductor substrate, resulting in the prevention of a defect such as a crack.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a first insulation film formed over a semiconductor substrate;
   a first dummy line and a lower line that are formed over the first insulation film and are formed on the same layer, wherein a second dummy line coupled to a buffer pattern in the first insulation film is formed between the first dummy line and the lower line;
   a second insulation film formed over the first dummy line, the lower line, and the first insulation film;
   a contact plug formed in the second insulation film and coupled to the lower line; and
   a fuse pattern coupled to the contact plug,
   wherein the fuse pattern is formed over the second insulation film so that a blowing region of the fuse pattern is disposed directly over a portion of the first dummy line.

2. The semiconductor device according to claim 1, wherein the fuse pattern includes copper (Cu).

3. The semiconductor device according to claim 1, wherein the first dummy line includes at least one of polysilicon, aluminum (Al), tungsten (W), cobalt (Co), titanium (Ti), tungsten silicide, cobalt silicide, and titanium silicide.

4. The semiconductor device according to claim 1, wherein the fuse pattern is longer than the first dummy line.

5. The semiconductor device according to claim 1, wherein the buffer pattern and the second dummy line are directly below a portion of the fuse pattern.

6. The semiconductor device according to claim 1, wherein the second dummy line includes at least one of polysilicon, aluminum (Al), tungsten (W), cobalt (Co), titanium (Ti), tungsten silicide, cobalt silicide, and titanium silicide.

* * * * *